United States Patent [19]

Plouviez

[11] Patent Number: 4,504,800
[45] Date of Patent: Mar. 12, 1985

[54] WIDE BAND FREQUENCY PHASE LOCKED LOOP FREQUENCY SYNTHESIZER

[75] Inventor: Eric Plouviez, Paris, France

[73] Assignee: Thomson-CSF, Paris, France

[21] Appl. No.: 396,593

[22] Filed: Jul. 9, 1982

[30] Foreign Application Priority Data

Jul. 24, 1981 [FR] France ................. 81 14418

[51] Int. Cl.³ .............................................. H03L 7/18
[52] U.S. Cl. ..................................... 331/1 A; 331/17; 331/25
[58] Field of Search ................. 331/1 A, 17, 18, 25

[56] References Cited

U.S. PATENT DOCUMENTS 3,828,271  8/1974  Schwanauer ............. 331/25 X
4,002,995  1/1977  Reed ......................... 331/1 A
4,078,213  3/1978  Campioni .................. 331/1 A X

FOREIGN PATENT DOCUMENTS 1473202  2/1967  France .

OTHER PUBLICATIONS

Underhill et al., "Fast Digital Frequency Synthesizer", Electronics Letters, May 25, 1978, vol. 14, No. 11, pp. 342, 343.

Primary Examiner—Siegfried H. Grimm
Attorney, Agent, or Firm—Cushman, Darby & Cushman

[57] ABSTRACT

The synthesizer comprises a single phase loop formed by two stages of a frequency divider inserted between the voltage controlled oscillator and the phase comparator. The synthesized frequency is taken from the connection between the two stages, which allows a frequency range to be obtained extending over a wide band with a voltage controlled oscillator itself having a small relative band width.

5 Claims, 2 Drawing Figures

WIDE BAND FREQUENCY PHASE LOCKED LOOP FREQUENCY SYNTHESIZER

The present invention relates to frequency synthesizers with relative wide band which allow a frequency to be generated chosen from a set of frequencies extending over a very wide range with the accuracy and stability of a reference driver frequency.

BACKGROUND OF THE INVENTION

Frequency synthesizers are well known in the art and are for the most part formed from an oscillator whose frequency is controlled by a voltage representing the phase difference between a periodic reference signal and a periodic signal obtained by division, by means of a divider, of the frequency of the signal supplied by the oscillator.

At balance, the frequency of the oscillator is equal to the reference frequency multiplied by the division ratio.

An example of a synthesizer of this type is described in French Pat. No. 1 473 202. With the synthesizer described, when the division ratio is changed, a set of discrete frequencies can be obtained whose accuracy and stability are related to the accuracy or the stability of the frequency of the reference signal. The set of frequencies obtained is between two frequency values which depend on the programming possibilities of the divider and on the maximum possible frequency deviation of the oscillator.

A problem arises however when the oscillator frequency must vary in an extensive frequency band, for, in this case, the variation of the division ratio makes the phase dependency of the divided frequency on the reference frequency very difficult to stabilize and, furthermore, the maximum frequency deviation of the oscillator is not always sufficient to allow the desired frequency variation.

To correct the phase dependency instability caused by the increase of the division, one solution consists in introducing into the phase control loop a digital-analog converter coupled as an attenuator of the control voltage of the oscillator, and controlled digitally to reduce the variations of the gain of the control loop due to too high a variation of the rank of the divider. However, the analog solution adopted introduces noise in the control input of the oscillator which makes use thereof delicate and requires additional adjustment circuits for cancelling out the frequency shift caused by the noise voltages delivered by the digital-analog converter.

To obtain a frequency variation of the synthesizer compatible with the frequency deviation possibilities of the oscillator, a solution is also known which is also described in U.S. Pat. No. 1 473 202 and which consists in placing in series with a variable rank divider a divider having several fixed stages, identical stage by stage, i.e. having the same division capacity and to divide, by means of a divider having several stages also fixed, the reference frequency before application thereof to the input of the phase comparator. The use of this solution is complicated for it requires the use of double switches for introducing into the two previously formed division chains the different division stages and an oscillator which is capable of being tuned in a frequency band extending at least over an octave.

The above-mentioned difficulties may be partially resolved by constructing a heterodyning frequency synthesizer using an oscillator with small frequency deviation and a frequency mixer allowing a signal to be obtained, from a mixer signal, whose frequency represents the difference between the frequencies of the mixer signal and the frequency supplied by the oscillator. The intermodulation products are eliminated by a low-pass filter which delivers the desired output signal.

The accuracy and stability of the mixer signal are of the same order of size as those of the reference signal, moreover, these two signals may be obtained from the same source, e.g. by different divisions of the frequency of a signal supplied by a high frequency generator.

Though this device is less delicate and offers better performances than the one where an oscillator is used tunable over a wide band, it remains nevertheless complicated, particularly because of the need to use a high performance low-pass filter at the output of the mixer. Furthermore, the use of a mixer results in deterioration of the phase noise and in the case where the output signal of the synthesizer is used to synchronize a digital data transmission, the phase noise may cause a synchronization error which is not constant in the frequency range obtained.

SUMMARY OF THE INVENTION

The object of the invention is to obviate the above-mentioned disadvantages by means of a synthesizer capable of synthesizing frequencies in a relative frequency band greater than that of the tuning frequency band of the oscillator, while having an oscillator with small tuning frequency band, a smaller phase control loop gain substantially constant over the whole range of frequencies synthesized and also having an accuracy and a phase noise considerably improved with respect to the already existing synthesizers.

To this end, the invention provides a relative wide band frequency synthesizer of the type comprising a voltage controlled oscillator, a divider for dividing by an integer number the frequency of the signal supplied by the oscillator, a phase comparator for comparing the signal delivered by the divider with a constant frequency driver signal and delivering an error signal measuring the frequency and phase difference between the compared signals and means for controlling this oscillator by means of this error signal, in which the divider comprises two stages having programmable division ranks and the synthesized signal is obtained at the connection between these two stages.

BRIEF DESCRIPTION OF THE DRAWINGS

Other features and advantages of the invention will appear clearly from the following description with reference to the accompanying figures, given solely by way of example and in which.

DESCRIPTION OF THE PREFERRED EMBODIMENTS

Figure 1:
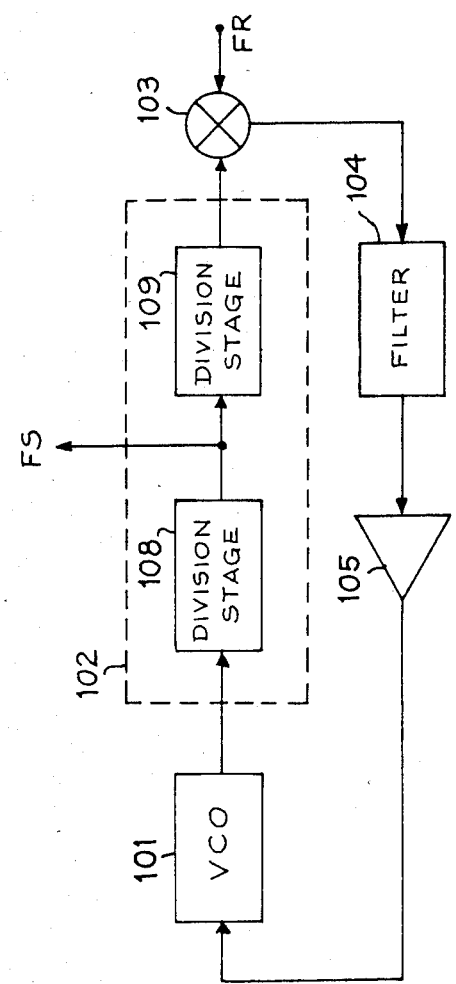
FIG. 1 is the diagram of a synthesizer in accordance with the invention.

The synthesizer shown schematically in FIG. 1 comprises a VCO type oscillator 101, VCO being the abbreviation of the term "voltage controlled oscillator", a frequency divider 102, a phase comparator 103, a filter 104 and an amplifier 105. The frequency divider 102 is formed by two division stages 108 and 109 connected in series. Oscillator 101 is voltage controlled by the output of amplifier 105. The frequency of oscillator 101 is applied to the input of stage 108 of divider 102. The signal FS at the desired frequency is taken from the output of the first stage 108 between stages 108 and 109. The signal at the output of divider 102 is supplied by stage 109 and is applied to an input of the phase comparator 103 whose other input receives a reference signal FR whose frequency is stable and accurate. The output of comparator 103 delivers a voltage which depends on the frequency difference between the frequency signal FR and the frequency signal supplied by the divider 109 applied to its inputs before locking on the phase loop, then when the phase loop is locked on this voltage is substantially proportional to the phase difference between these two signals. The output voltage of comparator 103 is applied to the input of filter 104 which allows the response of the loop to be stabilized. The output of filter 104 is connected to the input of amplifier 105 which amplifies the voltage supplied by the filter 104 to a level suitable for controlling oscillator 101. The looping thus provided takes place with feedback so that the error voltage, supplied by the phase comparator 103, tends to bring the frequency of the signal delivered by oscillator 101 to a value such that, after division in divider 102, the frequency of the signal at the output thereof is equal to the frequency of the reference signal FR. When frequency locking on is achieved, the system is stabilized, to maintain a substantially constant phase difference between the signal FR and the signal FS, so that it remains locked on.

Thus, if N1 designates the division rank of the first stage 108 and N2 the division rank of the second stage 109, the frequency of the output signal FS will be equal to the product of the frequency of the reference signal FR by N2 provided that the product of the frequency of FS multiplied by N1 is situated in the tuning band of the oscillator 101. Since it is possible to adjust the division ranks N1 and N2 of the two division stages 108 and 109 it is possible to obtain over a small tuning band of oscillator 101 a much wider range of synthesizable frequencies than was possible with the abovementioned synthesizers of the prior art.

Since the division ranks of the two dividers 108 and 109 may both have the value 1, it can be seen that the lowest frequency which is synthesizable is the reference frequency FR and the highest frequency which is synthesizable is the largest multiple integer of the reference frequency FR in the tuning band of the oscillator.

In fact, under these conditions, when this tuning band drops below a relative value, defined as being the ratio of the tuning band to the minimum frequency, of one hundred percent, we find that the higher frequencies are grouped together in batches of frequencies separated by the value of FR; these batches being themselves separated by holes at each division change of the first divider 108. When this division rank reaches a whole value NO defined by the formula:

$$\frac{1}{NO} \leqq \frac{F_{max} - F_{min}}{F_{min}}$$

the scale of frequencies then obtained is then continuous from a frequency determined by the largest multiple of the reference frequency FR in the tuning band of the oscillator divided by NO. This defines the range of synthesizable frequencies presenting in fact practical interest.

Figure 2:
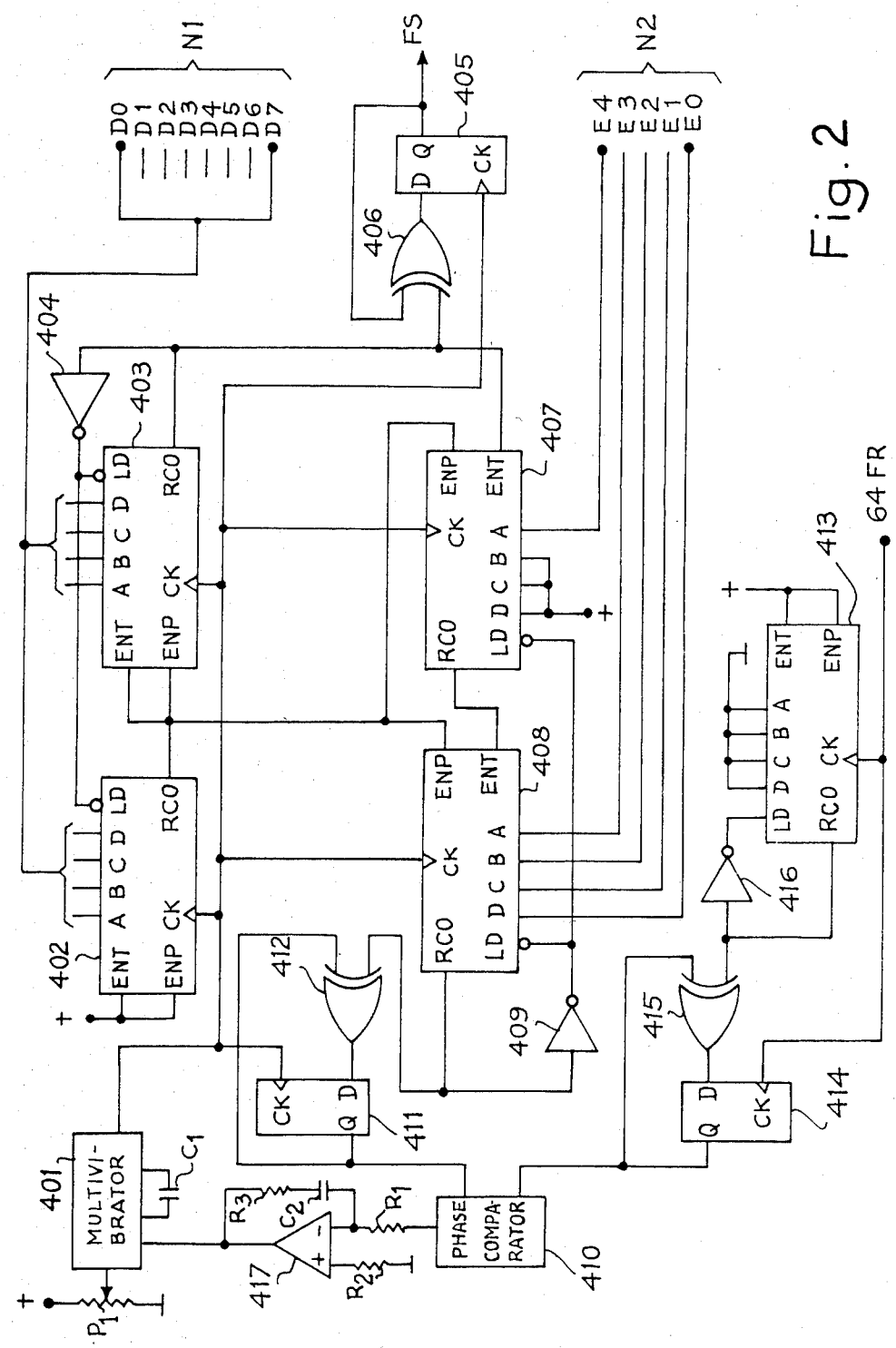
FIG. 2 is a diagram showing the construction of the synthesizer of FIG. 1.

A practical embodiment of the theoretical diagram of FIG. 1 is shown in FIG. 2. It allows 32 synchronizing signals to be obtained corresponding to 32 multiple frequencies of a basic reference frequency FR of 64 KHz. This generator allows for example 32 separate outputs to be synthesized in a digital network.

The voltage controlled oscillator 401 is a multivibrator of the 74S124 type tuned by means of an external potentiometer P1 of 4.7 Kohms and an external capacitor C1 of 39 microfarads to oscillate freely at about 6.9 MHz.

The output signal of this multivibrator is applied to a divider formed from two circuits 402 and 403 of the 74LS163 type connected in series by means more especially of an external inverter amplifier 404 of the 74LS04 type driven by the output of circuit 403 and controlling the LD inputs of the two circuits 402 and 403. The inputs ABCD of each of circuits 402 and 403 are connected in parallel to terminals D0 to D7 which allow, by means of a set of switches, not shown, the division rank of the counter formed by circuits 402 and 403 to be programmed to the desired number N1 chosen between 2 and 64.

The signal obtained at the output RCO of circuit 403 is applied to a divider by 2 formed from the flip-flop 405 of type 74LS74 connected with the exclusive OR circuit 406 of the 74LS86 type between its input and its output. The desired signal FS is obtained at the Q output of circuit 405.

The signal at the output RCO of the first divider is also applied to a second divider formed from circuits 407 and 408 of the 74LS163 type connected in series by means of an inverter amplifier 409 of the 74LS04 type. The DCBA inputs of circuit 408 and the A input of circuit 407 are connected in parallel to a set of terminals E0 to E4 which, by means of a set of switches not shown, allows the division rank N2 of the second divider formed by circuits 407 and 408 to be programmed from 1 to 32. The programming inputs B to D of circuit 407 are not used and are connected to a suitable positive voltage source.

The RCO output of circuit 408 is connected to a phase comparator 410 of the MC4044 type by a divider by 2 formed from circuits 411 and 412 and identical to the one formed by circuits 405 and 406.

The reference driver signal has, in this embodiment, a frequency of 2048 kHz, because it corresponds to a driver signal available in the equipment for which the synthesizer is adapted. This 64 FR signal is first of all divided by 32 in a divider formed by a circuit 413 of the 74LS163 type connected with an inverter amplifier 416 of the 74LS04 type connected between its RCO output and its LD input. The ABCD programming inputs of circuit 413 are not used and are connected to ground. The unused ENT and ENP inputs are connected to a positive source. The signal at the RCO output of this divider is applied to the phase comparator 410 through a divider by 2 formed by circuits 414 and 415 and identical to the circuit formed by circuits 405 and 406.

The error signal, from the comparison of the two signals at the inputs of phase comparator 410, is applied through a resistor R1 of 22 Kohms to the inverter input of a differential amplifier 417 of TDB156 type whose non inverting input is connected to ground through a resistor R2 of the same value. The error voltage thus amplified obtained at the output of amplifier 417 is applied to the frequency control input of multivibrator 401. It is also applied as feedback to the inverting input of amplifier 417 through a filtering cell formed from a resistor R3 of 3.3 Kohms in series with a capacitor C2 of 1 microfarad.

Thus, the open loop gain of the phase control loop is sufficiently constant whatever the variations of the division rank or of the dividers in the desired range, which allows stable control and minimum phase noise to be obtained. Thus, multiple frequencies may be obtained from 1 to 32, i.e. five octaves, of the 64 kHz reference frequency FR. The endmost values which the product $N1 \times N2$ must have, for N2 varying from 1 to 32 and FS from 64 kHz to 2048 kHz, are then 78 (for $N2=26$, $FS=1664$ kHz, $N1=3$) and 54 (for $N2=27$, $FS=1728$ kHz, $N1=2$). The oscillator will then have to be capable of covering the range of frequencies between 9984 kHz and 6912 kHz taking into account the division by 2 in circuit 405/406. The open loop gain variation is less over the whole of this range than four decibels.

What is claimed is:

1. A wide band frequency synthesizer, of the type comprising a voltage controlled oscillator, and a phase control loop, comprising a divider for dividing by an integer number the frequency of the signal supplied by the oscillator, a phase comparator for comparing the signal supplied by the divider with a constant reference frequency signal and delivering an error signal measuring the frequency and phase difference between the compared signals, and means for controlling the oscillator by means of this error signal, wherein the divider comprises first and second serially coupled divider means having programmable division ranks and the synthesized signal being obtained at the connection between the first and second divider means.

2. The synthesizer as claimed in claim 1, wherein the means for controlling the oscillator comprises a filter and an amplifier for obtaining a control voltage which acts with feedback on the oscillator with an open loop gain of the phase control loop substantially constant over all the frequencies delivered by the synthesizer.

3. The synthesizer as claimed in claim 2, wherein the constant reference frequency is applied to the phase comparator through a third divider means.

4. The synthesizer as claimed in claim 3, wherein the constant reference frequency is substantially equal to 64 kHz and the second divider means may be programmed for a division rank going from 1 to 32; the synthesizer in this case possibly supplying the first 32 multiple frequencies of 64 kHz extending over a range of 5 octaves.

5. The synthesizer as claimed in claim 4, wherein the oscillator is tunable between 6.9 and 10 MHz and the first divider means is programmable to a division rank from 2 to 40.

* * * * *